United States Patent
Kakimoto

(10) Patent No.: US 9,929,073 B2
(45) Date of Patent: Mar. 27, 2018

(54) SEMICONDUCTOR DEVICE

(71) Applicant: DENSO CORPORATION, Kariya, Aichi-pref. (JP)

(72) Inventor: Noriyuki Kakimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/540,695

(22) PCT Filed: May 7, 2016

(86) PCT No.: PCT/JP2016/002253
§ 371 (c)(1),
(2) Date: Jun. 29, 2017

(87) PCT Pub. No.: WO2016/189804
PCT Pub. Date: Dec. 1, 2016

(65) Prior Publication Data
US 2017/0358512 A1    Dec. 14, 2017

(30) Foreign Application Priority Data

May 27, 2015    (JP) ................. 2015-107448

(51) Int. Cl.
*H01L 31/058*    (2006.01)
*H01L 23/34*    (2006.01)
(Continued)

(52) U.S. Cl.
CPC ............ *H01L 23/34* (2013.01); *H01L 21/822* (2013.01); *H01L 25/07* (2013.01); *H01L 25/18* (2013.01);
(Continued)

(58) Field of Classification Search
CPC ....... H01L 23/34; H01L 21/822; H01L 25/07; H01L 25/18; H01L 27/04;
(Continued)

(56) References Cited

U.S. PATENT DOCUMENTS

| | | | |
|---|---|---|---|
| 2013/0062626 A1 | 3/2013 | Takao et al. | |
| 2013/0153900 A1 | 6/2013 | Kinouchi et al. | |
| 2014/0362490 A1* | 12/2014 | Maekawa | H03K 17/0828 361/103 |

FOREIGN PATENT DOCUMENTS

| JP | 61-231618 A | 10/1986 |
|---|---|---|
| JP | 2008-061180 A | 3/2008 |

(Continued)

*Primary Examiner* — Thien F Tran
(74) *Attorney, Agent, or Firm* — Posz Law Group, PLC

(57) ABSTRACT

A semiconductor device includes: a first power semiconductor element; a second power semiconductor element that is connected in parallel with the first power semiconductor element; a voltage changing unit that changes a voltage applied to a control terminal of the first power semiconductor element when the second power semiconductor element is turned on; a detection unit that detects a current flowing in the first power semiconductor element when the voltage changing unit has changed the voltage applied to the control terminal of the first power semiconductor element; and a temperature estimation unit that estimates a temperature of the first power semiconductor element based on a characteristic of the change of the current of the first power semiconductor element with respect to a change of the voltage applied to the first power semiconductor element.

13 Claims, 3 Drawing Sheets

(51) Int. Cl.
*H01L 21/822* (2006.01)
*H03K 17/08* (2006.01)
*H01L 27/04* (2006.01)
*H01L 25/07* (2006.01)
*H01L 25/18* (2006.01)

(52) U.S. Cl.
CPC ............. *H01L 27/04* (2013.01); *H03K 17/08* (2013.01); *H01L 2224/40137* (2013.01); *H01L 2924/0002* (2013.01)

(58) Field of Classification Search
CPC .. H01L 2224/40137; H01L 2924/0002; H03K 17/08
USPC .......................................... 257/467; 361/103
See application file for complete search history.

(56) References Cited

FOREIGN PATENT DOCUMENTS

| | | |
|---|---|---|
| JP | 2008-172132 A | 7/2008 |
| JP | 2012-253202 A | 12/2012 |
| JP | 2014-110497 A | 6/2014 |
| JP | 2015-015564 A | 1/2015 |
| WO | 2016/189817 A1 | 12/2016 |
| WO | 2016/189830 A1 | 12/2016 |

\* cited by examiner

US 9,929,073 B2

SEMICONDUCTOR DEVICE

CROSS REFERENCE TO RELATED APPLICATIONS

This application is a U.S. national stage of International Patent Application No. PCT/JP2016/002253 filed on May 7, 2016 and is based on Japanese Patent Application No. 2015-107448 filed on May 27, 2015, the disclosure of which is incorporated herein by reference.

TECHNICAL FIELD

The present disclosure relates to a semiconductor device having a first power semiconductor element and a second power semiconductor element, which are connected in parallel with each other.

BACKGROUND ART

For example, as described in patent literature 1, it has been known a semiconductor device that has a temperature-sensitive diode in a semiconductor chip so as to measure the temperature of the semiconductor chip.

PRIOR ART LITERATURE

Patent Literature

Patent Literature 1: JP 2008-172132 A

SUMMARY OF INVENTION

In a case where the temperature is measured using a temperature-sensitive diode, a semiconductor chip needs to have the temperature-sensitive diode, wirings connected to the temperature-sensitive diode, and pads to be connected to an external circuit. Therefore, a chip area increases due to such components. In regard to this point, when a wide band gap semiconductor, such as SiC, is used as a semiconductor material, the cost of the semiconductor chip per unit area is increased. Namely, the increase of the chip area largely affects the production costs.

Further, a step of forming the temperature-sensitive diode in the semiconductor chip is required. Therefore, a production process is likely to be complicated, resulting in the increase of the production costs.

It is an object of the present disclosure to provide a semiconductor device capable of measuring the temperature without using a temperature-sensitive diode.

According to an aspect of the present disclosure, a semiconductor device includes: a first power semiconductor element; a second power semiconductor element connected in parallel with the first power semiconductor element; a voltage changing unit that changes a voltage applied to a control terminal of the first power semiconductor element when the second power semiconductor element is turned on; a detecting unit that detects a current flowing in the first power semiconductor element when the voltage changing unit has changed the voltage applied to the control terminal of the first power semiconductor element; and a temperature estimating unit that estimates a temperature of the first power semiconductor element based on a characteristic of a change of the current flowing in the first power semiconductor element with respect to a change of the voltage applied to the control terminal of the first power semiconductor element.

In the semiconductor device described above, the first power semiconductor element and the second power semiconductor element are connected in parallel. The voltage changing unit changes the voltage applied to the control terminal of the first power semiconductor element when the second power semiconductor element is turned on. In this case, the current flowing in the first power semiconductor element changes with the change of the voltage applied to the control terminal. This characteristic of the change of the current with the change of the voltage has temperature dependency. Thus, the temperature of the first power semiconductor element can be estimated based on this characteristic.

In the case where the voltage applied to the control terminal of the first power semiconductor element is changed, even if the first power semiconductor element is brought into a shut-down state, the second power semiconductor element, which is connected in parallel with the first power semiconductor element, is kept in an on state. Therefore, a current necessary to be conducted as in the power semiconductor element can be conducted through the second power semiconductor element. Even when the voltage applied to the control terminal of the first power semiconductor element is changed, it is less likely that the current will excessively flow in the first power semiconductor element, or the voltage will be excessively applied to the first power semiconductor element.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Hereinafter, embodiments of the present disclosure will be described in detail with reference to the drawings.

Figure 1:
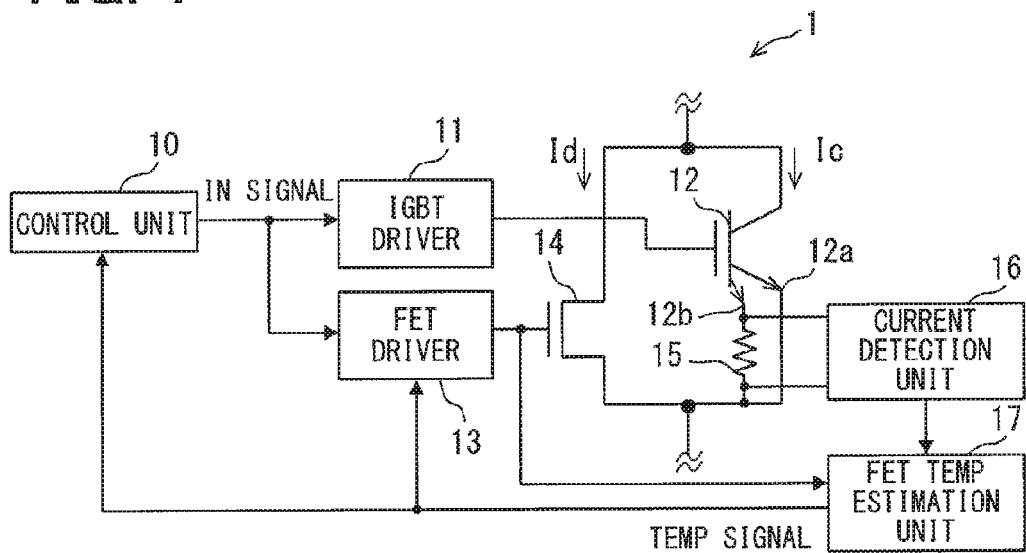
FIG. 1 is a block diagram illustrating an overall structure of a semiconductor device according to a first embodiment of the present disclosure.

As shown in FIG. 1, a semiconductor device 1 of the present embodiment includes, as a power semiconductor element, a field effect transistor (hereinafter referred to as FET) 14 and an insulated gate bipolar transistor (hereinafter referred to as IGBT) 12. The FET 14 corresponds to a first power semiconductor element, and the IGBT 12 corresponds to a second power semiconductor element. The FET 14 and the IGBT 12 are connected in parallel. That is, an emitter of the IGBT 12 and a source of the FET 14 are connected to each other, and a collector of the IGBT 12 and a drain of the FET 14 are connected to each other.

A basic structure of the IGBT 12 is, as well-known, that a p+ layer is added to a drain side of an n-channel MOSFET, for example. Therefore, when the IGBT 12 is turned on, conductivity modulation in which holes are injected from the added p+ layer to an n− layer (drift layer) occurs, and thus a resistance of the n− layer reduces. As a result, the IGBT 12 can conduct a large amount of current. Also, it is possible to suppress conduction loss and to reduce a chip size. In the present embodiment, the IGBT 12 is made of a silicon semiconductor.

As described above, since the FET 14 and the IGBT 12 are connected in parallel, and are both turned on, a current can be shared between the FET 14 and the IGBT 12. For this reason, the FET 14 and the IGBT 12 can contribute to further suppress the conduction loss as the power semiconductor element. Further, in the present embodiment, the FET 14 is provided by a MOSFET, a JFET or a HEMT, which is made of a wide band gap semiconductor, such as SiC or GaN. In such a case, the conduction loss of the FET 14 of itself can be suppressed, and the loss is thus further suppressed.

The power semiconductor element made of the IGBT 12 and the FET 14 can be used under a condition of high voltage and large current, and is suitably used as a switching element of a power conversion device, such as an inverter, a converter, and a chopper.

The IGBT 12 is configured to include a plurality of cells connected in parallel, each of the cells having the basic structure as described hereinabove. The plurality of cells is divided into a large number of main cells and a small number of sensing cells. The large number of main cells are connected to a first emitter terminal 12a, and the small number of sensing cells are connected to a second emitter terminal 12b. A divided ratio of the main cells and the sensing cells is preset. Therefore, when the IGBT 12 is turned on, most of a collector current Ic flowing between the collector and the emitter of the IGBT 12 flows via the first emitter terminal 12a connected to the main cells, and a predetermined rate of the current (sensing current) flows via the second emitter terminal 12b connected to the sensing cells.

A sensing resistor 15 is connected on a current path of the sensing current that flows via the second emitter terminal 12b of the IGBT 12. Therefore, when the sensing current flows in the censing cells, a voltage depending on the magnitude of the sensing current is generated between both the ends of the sensing resistor 15. The voltage across the sensing resistor 15 is provided to a current detection unit 16, which will be described later. In this way, since the sensing resistor 15 is connected to the second emitter terminal 12b through which the sensing current flows, loss in the sensing resistor 15 can be suppressed. Further, the sensing cells for current detection are provided in the IGBT 12 made of silicon. Therefore, the costs can be reduced, as compared with a case where the sensing cells are provided in the FET 14 made of a wide band gap semiconductor.

An IGBT driver 11 is connected to a gate of the IGBT 12. The gate of the IGBT 12 serves as a control terminal. The IGBT driver 11 generates a voltage to be applied to the gate of the IGBT 12 so as to turn on and off the IGBT 12 in accordance with an IN signal (PWM signal), as a driving signal, provided from a control unit 10.

A FET driver 13 is connected to a gate of the FET 14. The gate of the FET 14 serves as a control terminal of the FET 14. The FET driver 13 generates a voltage to be applied to the gate of the FET 14 so as to turn on and off the FET 14 in accordance with the IN signal described hereinabove. The FET driver 13 not only generates a gate application voltage to be applied to the gate of the FET 14 in accordance with the IN signal, but also changes (increases and/or decreases) the gate application voltage at a predetermined timing. The FET driver 13 corresponds to a voltage changing unit.

The current detection unit 16 receives the voltage across the sensing resistor 15, and detects the current flowing in the sensing cells of the IGBT 12. That is, since the resistance value of the sensing resistor 15 is a known value, the current detection unit 16 can detect the sensing current based on the voltage across the sensing resistor 15. Further, the current detection unit 16 calculates a collector current Ic based on the sensing current, using the divided ratio of the sensing cells and the main cells. The collector current Ic corresponds to the sum of the currents flowing in the main cells and the currents flowing in the sensing cells. The collector current Ic calculated is provided to a FET temperature estimation unit 17.

The FET temperature estimation unit 17 receives the collector current Ic of the IGBT 12 output from the current detection unit 16 and the gate voltage Vgs of the FET 14. The FET temperature estimation unit 17 estimates the temperature of the FET 14 based on the collector current IC of the IGBT 12 received and the gate voltage Vgs of the FET 14. A method of estimating the temperature by the FET temperature estimation unit 17 will be described later in detail.

The temperature estimated by the FET temperature estimation unit 17 is provided to the control unit 10 and the FET driver 13. In the case where the temperature estimated by the FET temperature estimation unit 17 is equal to or higher than a predetermined threshold temperature, it is preferable that the FET driver 13 stops to output the gate voltage to the FET 14, even if the IN signal indicates turning on of the FET 14 (i.e., even if the PWM signal is on). In this case, since the FET 14 can be smoothly shifted to an off state, it is less likely that the temperature of the FET 14 will further rise.

In the case where the temperature estimated by the FET temperature estimation unit 17 is equal to or higher than the predetermined threshold temperature, the control unit 10 may reduce a duty ratio of the PWM signal or stop outputting of the PWM signal. This is because, when the temperature of the FET 14 is high, there is a possibility that the temperature of the IGBT 12 is also high.

Next, the method of estimating the temperature by the FET temperature estimation unit 17 will be described.

Firstly, temperature dependence of the FET 14 will be described based on a graph of FIG. 2. The graph of FIG. 2 shows a relationship between the gate voltage Vgs and the drain current Id of the FET 14 of a case where the temperature of the FET 14 is high and of a case where the temperature of the FET 14 is low.

Figure 2:
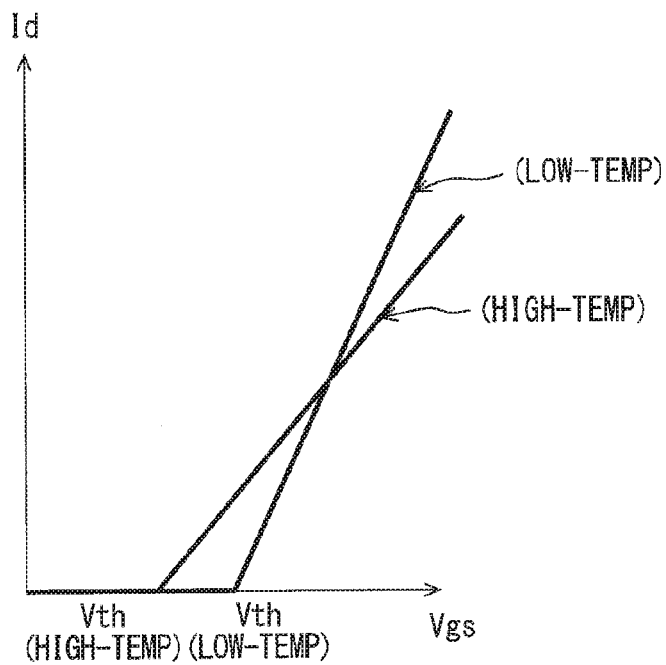
FIG. 2 is a graph illustrating a relationship between a gate voltage Vgs and a drain current Id of a FET of a case where the FET is at a high temperature and of a case where the FET is at a low temperature.

As shown in FIG. 2, in the case where the temperature of the FET 14 is high, the drain current Id begins to flow at a relatively low gate voltage Vgs. That is, in the case where the temperature of the FET 14 is high, the FET 14 has a relatively low on-threshold voltage Vth. Note that the on-threshold voltage Vth can be defined as a voltage at which the drain current Id is zero when the gate voltage Vgs is lowered. On the other hand, in the case where the temperature of the FET 14 is low, the drain current Id begins to flow only when a relatively high gate voltage Vgs, which is higher than that when the temperature of the FET 14 is high, is applied. That is, in the case where the temperature of the FET 14 is low, the FET 14 has a relatively high on-threshold voltage Vth. Namely, the on-threshold voltage Vth of the FET 14 indicates negative temperature characteristics.

Further, as shown in FIG. 2, in the case where the temperature of the FET 14 is high, the change of the drain current Id relative to the change of the gate voltage Vgs begins to be relatively moderate after the drain current Id begins to flow. On the other hand, in the case where the temperature of the FET 14 is low, the change of the drain current Id relative to the change of the gate voltage Vgs is relatively steep, as compared with that when the temperature of the FET 14 is high. Namely, the gradient of the change of the drain current Id relative to the change of the gate voltage Vgs in the FET 14 also indicates negative temperature characteristics.

As described above, in the FET 14, characteristics of the on-threshold voltage Vth and the gradient of the change of the drain current Id relative to the change of the gate voltage Vgs vary depending on the temperature. Namely, the FET 14 has the temperature dependencies in regard to these characteristics.

Figure 3:
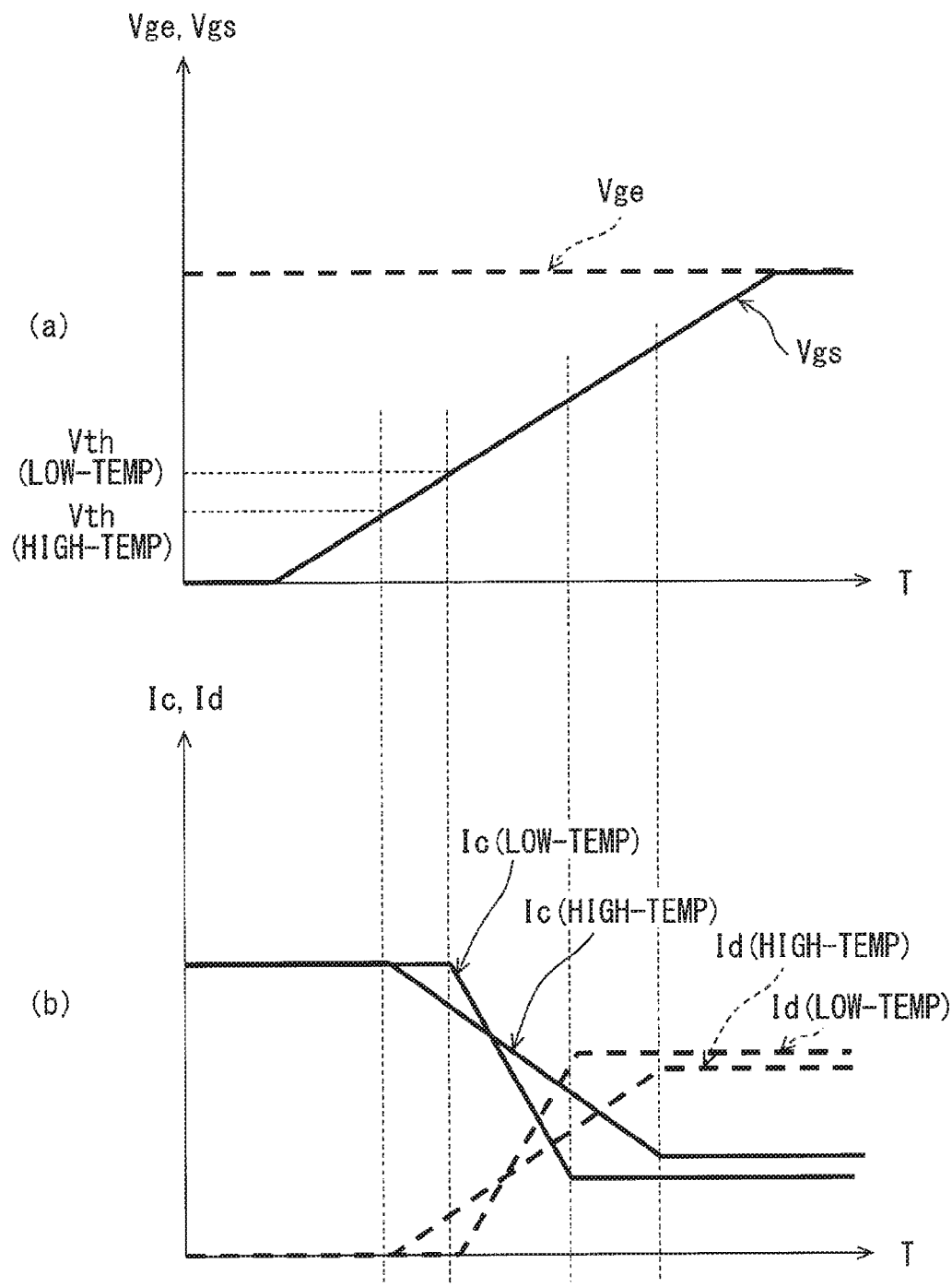
FIG. 3 is a diagram in which (a) is a graph illustrating a change of the gate voltage Vgs of the FET with time, and (b) is a graph illustrating a change of the drain current Id of the FET and a collector current Ic of the IGBT with time.

Next, it will be explained, with reference to FIG. 3, about the change of the collector current Ic of the IGBT 12 in accordance with the change of the drain current Id of the FET 14 when the gate voltage Vgs of the FET 14 is changed to increase. In FIG. 3, an upper graph (a) illustrates the change of the gate voltage Vgs of the FET 14 with time, and a lower graph (b) illustrates the changes of the drain current Id of the FET 14 and the collector current Ic of the IGBT 12, with time.

In the present embodiment, as shown in (a) of FIG. 3, the FET driver 13 is configured to change the gate voltage Vgs of the FET 14 in a period where the IGBT driver 11 generates the gate voltage Vgs for turning on the IGBT 12. Therefore, when the gate voltage Vgs of the FET 14 has been changed, even if the FET 14 is brought into a shut-off state, since the IGBT 12 connected in parallel with the FET 14 is in the on state, a conduction current required as in the power semiconductor element made of the IGBT 12 and the FET 14 can be conducted through the IGBT 12. Further, even though the gate voltage Vgs of the FET 14 is changed, it is less likely that the current will excessively flow in the FET 14, or the voltage will be excessively applied to the FET 14.

After the gate voltage Vgs of the FET 14 is changed from zero, the drain current Id begins to flow from a time point where the gate voltage Vgs reaches the on-threshold voltage Vth, as shown by dashed lines in (b) of FIG. 3. Thus, the collector current Ic flowing in the IGBT 12 reduces by the amount corresponding to the increased amount of the drain current Id flowing in the FET 14. The increased amount of the drain current Id of the FET 14 is equal to the decreased amount of the collector current Ic of the IGBT 12. The current detection unit 16 detects the collector current Ic of the IGBT 12, and provides the detected current to the FET temperature estimation unit 17. Thus, the FET temperature estimation unit 17 can calculate the drain current Id of the FET 14 and the change of the drain current Id based on the detected collector current is of the IGBT 12.

In the present embodiment, as described hereinabove, the FET temperature estimation unit 17 is configured to calculate the drain current Id of the FET 14. Alternatively, the drain current Id of the FET 14 may be calculated in the current detection unit 16, and then be provided to the FET temperature estimation unit 17.

The FET temperature estimation unit 17 calculates the drain current Id of the FET 14 and the change of the drain current Id, based on the collector current Ic of the IGBT 12 detected by the current detection unit 16. Also, the FET temperature estimation unit 17 receives the gate voltage Vgs, which is to be applied to the gate of the FET 14.

Therefore, the FET temperature estimation unit 17 determines that the drain current Id has begun to flow based on the change of the drain current Id, and detects the gate voltage Vgs received at the timing where the beginning of the flow of the drain current Id is determined as the on-threshold voltage Vth. Further, the FET temperature estimation unit 17 can calculate the gradient of the change of the drain current Id with respect to the gate voltage Vgs, using the drain current Id and the gate voltage Vgs, which are obtained simultaneously.

As shown in (b) of FIG. 3, the on-threshold voltage Vth of the FET 14 and the gradient of the change of the drain current Id with respect to the change of the gate voltage Vgs vary depending on the change of the temperature of the FET 14. Therefore, the FET temperature estimation unit 17 can estimate the temperature of the FET 14 based on the on-threshold voltage Vth and/or the gradient of the change of the drain current Id with respect to the change of the gate voltage Vgs, using a predetermined computation formula or map. That is, the FET temperature estimation unit 17 may estimate the temperature of the FET 14 based on one of the on-threshold Vth and the gradient of the change of the drain current Id with respect to the change of the gate voltage Vgs. As another example, the FET temperature estimation unit 17 may estimate the temperature of the FET 14 based on both of the on-threshold voltage Vth and the gradient of the change of the drain current Id with respect to the change of the gate voltage Vgs.

Figure 4:
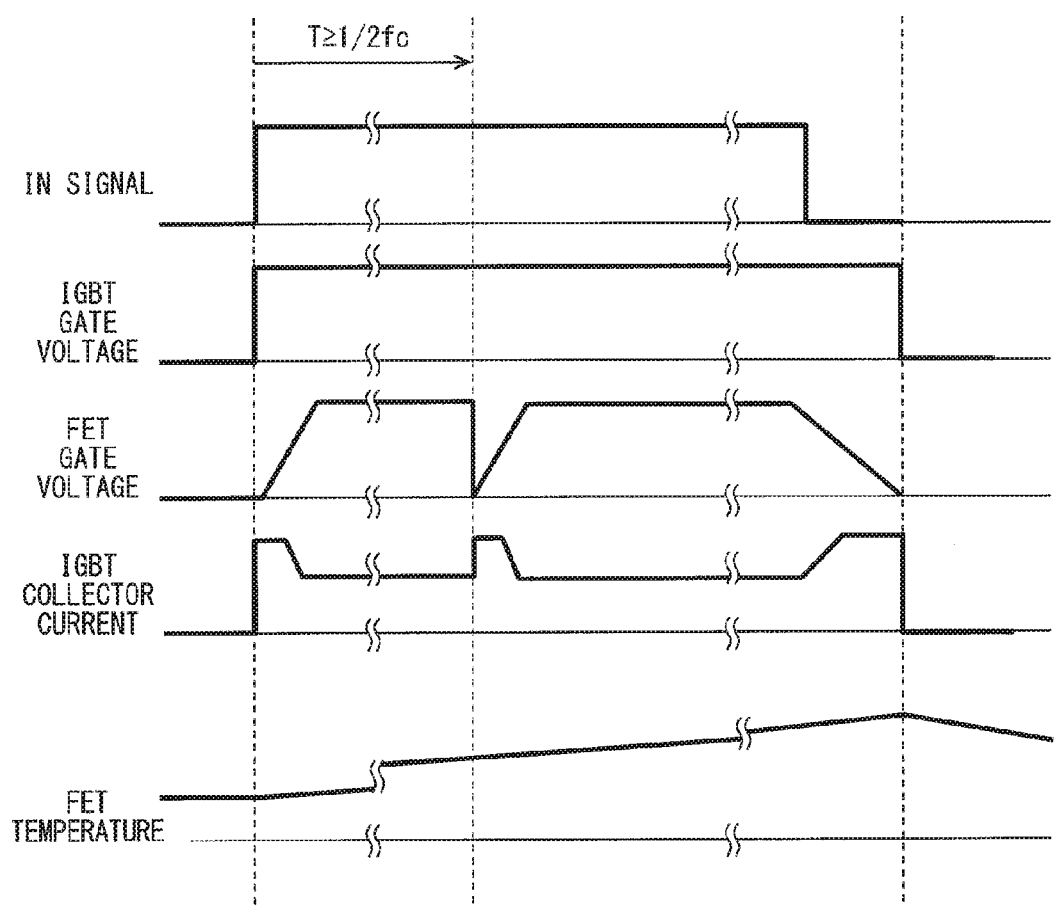
FIG. 4 is a diagram for explaining a specific timing to estimate the temperature of the FET.

Lastly, as shown in FIG. 4, specific timings to execute the temperature estimation of the FET 14 will be described.

As described above, it is necessary to change of the gate voltage Vgs of the FET 14 in order to estimate the temperature of the FET 14. When the gate voltage Vgs of the FET 14 is changed, the IGBT 12 needs to be turned on so as to restrict an excess current from flowing in the FET 14 due to the changing of the gate voltage Vgs of the FET 14. In other words, it is possible to change the gate voltage Vgs of the FET 14 as long as the IGBT 12 is turned on. Therefore, the temperature estimation of the FET 14 can be executed at various timings.

As shown in FIG. 4, for example, the FET driver 13 may begin to change the gate voltage Vgs of the FET 14 when the IN signal (PWM signal) is turned on as a trigger. In this case, since the gate voltage Vgs of the FET 14, before the PWM signal is turned on, is zero, the FET driver 13 increases the gate voltage Vgs so that the gate voltage Vgs has a predetermined gradient with respect to the time.

As described above, since the change of the gate voltage Vgs of the FET 14 is begun in synchronization with the turning on of the PWM signal, the temperature estimation can be executed, even if the PWM signal having a small duty ratio is output. Therefore, the temperature estimation of the FET 14 can be executed almost every time the PWM signal is turned on, and thus the frequency of executing the temperature estimation can be increased. Note that, if the PWM signal is turned off during the changing of the gate voltage Vgs, the FET driver 13 ends to output the gate voltage Vgs at the time point where the PWM signal is turned off. Therefore, in a case where the PWM signal is excessively short, the FET temperature estimation unit 17 cannot obtain sufficient data for the temperature estimation. As a result, there is a case where the temperature estimation cannot be executed.

As shown in FIG. 4, the FET driver 13 may begin to change the gate voltage Vgs of the FET 14 when a predetermined time period T has elapsed from the time point where the PWM signal is turned on. In this case, the temperature of the FET 14 can be estimated when the temperature has risen after the FET 14 begun the operation. Therefore, it is possible to further accurately detect whether the FET 14 is in an overheated state or not.

As shown in FIG. 4, for example, the predetermined time period T may be set to a period equal to or greater than a half of a period fc of the PWM signal. This is because, when the time period corresponding to the half of the period fc of the PWM signal has elapsed after the PWM signal was turned on, it is expected that the temperature of the FET 14 has risen by a corresponding magnitude. Also, since it is considered that the PWM signal including a signal with a length corresponding to the half of the period fc is output at certain frequency, it is less likely that the opportunity of the temperature estimation will be excessively reduced.

In the case of beginning the change of the gate voltage Vgs of the FET 14 after the predetermined time period T has elapsed after the turning on of the PWM signal, as shown in FIG. 4, the changing of the gate voltage Vgs is begun in a state where a predetermined gate voltage Vgs is being applied. In the present embodiment, therefore, the gate voltage Vgs is substantially reduced to zero once, and then increased at a predetermined gradient with respect to the time. Alternatively, the gate voltage Vgs may be gradually reduced to zero at a predetermined gradient from the state where the predetermined gate voltage Vgs is being applied, and then be returned to the original gate voltage Vgs.

As shown in FIG. 4, the FET driver 13 may begin to change the gate voltage Vgs of the FET 14 when the PWM signal is turned off, as a trigger. Also in this case, as shown in FIG. 4, the changing of the gate voltage Vgs is begun from the state where the predetermined gate voltage Vgs is being applied.

In this case, however, the PWM signal has been already turned off. Therefore, differently from the case where the changing of the gate voltage Vgs is begun when the predetermined time period T has elapsed after the turning on of the PWM signal, the gate voltage Vgs is gradually reduced to zero at a predetermined gradient from the state where the predetermined gate voltage Vgs is being applied, and the application of the gate voltage Vgs is ended when the gate voltage Vgs reaches zero.

As described above, in the case where the changing of the gate voltage Vgs is begun in synchronization with the turning off of the PWM signal, the temperature of the FET 14 can be estimated when the temperature of the FET 14 is the highest. Therefore, it is possible to further accurately detect whether the FET 14 is in an overheated state or not.

In the case where the gate voltage Vgs of the FET 14 is changed when the PWM signal is turned off as a trigger, the IGBT 12 needs to be kept on by generating the gate voltage Vgs by the IGBT driver 11 in a period where the FET driver 13 is generating the gate voltage Vgs. Therefore, the IGBT driver 11 monitors the gate voltage Vgs to the FET 14, and continues to generate the gate voltage Vgs to the IGBT 12 until the gate voltage Vgs to the FET 14 reaches zero even after the PWM signal is turned off. In this case, therefore, the FET 14 can be appropriately protected.

Several exemplary timings to estimate the temperature of the FET 14 are described hereinabove with reference to FIG. 4. In fact, the temperature of the FET 14 may be estimated at a timing that is at least one of the timings described hereinabove. As another example, the temperature of the FET 14 may be estimated at multiple timings arbitrary selected.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

In the embodiment described hereinabove, for example, the first power semiconductor element is the FET 14 made of a wide band gap semiconductor, and the second power semiconductor element is the IGBT 12 made of silicon. However, the semiconductor materials and the types of elements may not be limited to those examples. For example, both of the first power semiconductor element and the second power semiconductor element may be made of FETs, or IGBTs. As further another example, the first power semiconductor element and the second power semiconductor element may be other types of elements. As still another example, both of the first power semiconductor element and the second power semiconductor element may be made of silicon or wide band gap semiconductor.

In the embodiment described hereinabove, the temperature of the FET 14 as the first power semiconductor element is exemplarily estimated using the collector current Ic flowing in the IGBT 12 as the second power semiconductor element. As another example, a sensing cell and a sensing resistor may be provided on the FET 14 to detect the drain current Id of the FET 14, and the temperature of the FET 14 may be estimated by the drain current Id detected.

The temperatures of the first power semiconductor element and the second power semiconductor element may be estimated by changing the gate voltage to the first power semiconductor element and the gate voltage to the second power semiconductor element at different timings. Note that, also in the case where the temperatures of both of the first and second power semiconductor elements are estimated, it is preferable that the sensing resistor is provided on either one of the elements, and the temperatures of both of the first and second semiconductor elements are estimated using the current detected by the sensing cell. In this case, since the sensing cell is shared, the structure can be simplified.

In the embodiment described hereinabove, the temperature estimation is begun in synchronization with the turning off of the PWM signal, based on the turning off of the PWM signal as an example of the timing to estimate the temperature. However, in the case where the temperature estimation is begun in synchronization with the turning off of the PWM signal, the IGBT 12 and the FET 14 remain in the on states for a predetermined time period after the PWM signal is turned off.

In order to shorten the on period of the IGBT 12 and the FET 14 after the PWM signal is turned off, an instruction circuit to instruct the FET driver 13 to begin the changing of the gate voltage Vgs a predetermined time period before the turning off of the PWM signal may be provided. For example, the instruction circuit can be configured to obtain information on the length of the PWM signal from the control unit 10, count the timing the predetermined time period before the turning off the PWM signal, and instruct to begin the changing of the gate voltage Vgs at the timing where the counting is completed.

The invention claimed is:
1. A semiconductor device comprising:
a first power semiconductor element;
a second power semiconductor element that is connected in parallel with the first power semiconductor element;
a voltage changing unit that changes a voltage applied to a control terminal of the first power semiconductor element when the second power semiconductor element is turned on;

a detection unit that detects a current flowing in the first power semiconductor element when the voltage changing unit has changed the voltage applied to the control terminal of the first power semiconductor element; and a temperature estimation unit that estimates a temperature of the first power semiconductor element based on a characteristic of a change of the current of the first power semiconductor element with respect to a change of the voltage applied to the control terminal of the first power semiconductor element.

2. The semiconductor device according to claim 1, wherein
the first power semiconductor element is an element made of a wide band gap semiconductor.

3. The semiconductor device according to claim 1, wherein
the second power semiconductor element is an element made of silicon.

4. The semiconductor device according to claim 3, wherein
the second power semiconductor element includes a plurality of cells connected in parallel,
the second power semiconductor element includes a first terminal in which a current flows and a second terminal in which a current flows, the current flowing in the first terminal being greater than the current flowing in the second terminal depending on a number of the cells connected to each of the first terminal and the second terminal, and
the detection unit detects the current flowing in the second terminal, and detects the current flowing in the first power semiconductor element based on the detected current flowing in the second terminal.

5. The semiconductor device according to claim 1, wherein
when the temperature estimated by the temperature estimation unit is equal to or higher than a predetermined threshold temperature, the voltage changing unit applies a voltage, by which the current flowing in the first power semiconductor element is zero, to the control terminal so as to shut off the first power semiconductor element.

6. The semiconductor device according to claim 1, wherein
each of the first power semiconductor element and the second power semiconductor element is turned on and off in accordance with an PWM signal, and
the voltage changing unit begins to change the voltage applied to the control terminal of the first power semiconductor element, when a predetermined time period has elapsed after the PWM signal was turned on, for detecting the temperature of the first power semiconductor element.

7. The semiconductor device according to claim 6, wherein
the predetermined time period is set to a period equal to or greater than a half of a period of the PWM signal.

8. The semiconductor device according to claim 1, wherein
each of the first power semiconductor element and the second power semiconductor element is turned on and off in accordance with a PWM signal,
the semiconductor device further comprising
an instruction unit that instructs the voltage changing unit to begin to change the voltage at a time point a predetermined time period before the PWM signal is turned off, wherein
the voltage changing unit begins to change the voltage applied to the control terminal of the first power semiconductor element when the voltage-changing unit is instructed by the instruction unit.

9. The semiconductor device according to claim 1, wherein
each of the first power semiconductor element and the second power semiconductor element is turned on and off in accordance with a PWM signal, and
the voltage changing unit begins to change the voltage applied to the control terminal of the first power semiconductor element, based on turning off of the PWM signal as a trigger, for detecting the temperature of the first power semiconductor element.

10. The semiconductor device according to claim 9, wherein
the second power semiconductor element is shut off in synchronization with shutting off of the first power semiconductor element, after detection of the temperature of the first power semiconductor element is completed.

11. The semiconductor device according to claim 1, wherein
each of the first power semiconductor element and the second power semiconductor element is turned on and off in accordance with a PWM signal, and
the voltage changing unit begins to change the voltage applied to the control terminal of the first power semiconductor element in synchronization with turning on of the PWM signal, for detecting the temperature of the first power semiconductor element.

12. The semiconductor device according to claim 1, wherein
the first power semiconductor element is provided by of a field effect transistor, and
the second power semiconductor element is provided by an insulated gate bipolar transistor.

13. The semiconductor device according to claim 1, wherein
the temperature estimation unit estimates the temperature based on at least one of a gradient of the change of the current with respect to the change of the voltage applied and a voltage at which the current is zero, as the characteristic of the change of the current with respect to the change of the voltage applied.

* * * * *